(12) United States Patent
Lee

(10) Patent No.: US 6,251,737 B1
(45) Date of Patent: Jun. 26, 2001

(54) METHOD OF INCREASING GATE SURFACE AREA FOR DEPOSITING SILICIDE MATERIAL

(75) Inventor: Tong-Hsin Lee, Taipei Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/434,047

(22) Filed: Nov. 4, 1999

(51) Int. Cl.[7] .................................................. H01L 21/336
(52) U.S. Cl. .......................... 438/307; 438/305; 438/585; 438/592
(58) Field of Search .................................. 438/307, 305, 438/299, 301, 306, 592, 579, 574, 585

(56) References Cited

U.S. PATENT DOCUMENTS

| | | | |
|---|---|---|---|
| 5,384,479 | * | 1/1995 | Taniguchi ............................. 257/412 |
| 5,405,787 | * | 4/1995 | Kurimoto ............................. 438/305 |
| 5,545,578 | * | 8/1996 | Park et al. ........................... 438/305 |
| 5,972,123 | * | 10/1999 | Verhaverbeke ......................... 134/3 |
| 5,981,383 | * | 11/1999 | Lur et al. ............................. 438/592 |

* cited by examiner

Primary Examiner—Michael Trinh
(74) Attorney, Agent, or Firm—Charles C.H. Wu; Charles C.H. Wu & Associates

(57) ABSTRACT

A method for increasing gate surface area for depositing silicide material. A silicon substrate having device isolation structures therein is provided. A stack of sacrificial layers comprising a first sacrificial layer at the bottom, a second sacrificial layer in the middle and a third sacrificial layer on top is formed over the silicon substrate. A gate opening that exposes a portion of the substrate is formed in the stack of sacrificial layers. A portion of the second sacrificial layer exposed by the gate opening is next removed to form a side opening on each side of the gate opening. The gate opening together with the horizontal side opening form a cross-shaped hollow space. A gate oxide layer is formed at the bottom of the gate opening. Polysilicon material is deposited to fill the gate opening and the side openings, thereby forming a cross-shaped gate polysilicon layer. The third, the second and the first sacrificial layers are removed. A metal silicide layer is formed over the gate polysilicon layer.

30 Claims, 3 Drawing Sheets

METHOD OF INCREASING GATE SURFACE AREA FOR DEPOSITING SILICIDE MATERIAL

BACKGROUND OF THE INVENTION

1. Field of the Invention

The present invention relates to a method of manufacturing a semiconductor device. More particularly, the present invention relates to a method of manufacturing a metal-oxide-semiconductor (MOS) transistor.

2. Description of the Related Art

In the manufacturing of deep submicron devices, the level of integration is increased. Hence, line width, contact area and junction depth of all devices are reduced. To improve the quality of devices and to lower transmission delay due to an increase in electrical resistance and capacitor (RC-delay), silicide layers are usually formed over the MOS transistors. The silicide layers are formed over the polysilicon gate and the source/drain terminals so that contact resistance at these junctions is lowered. Since there is no need to perform photolithographic operation, the step of forming silicide layers over the terminals of MOS transistors is often referred to as a self-aligned silicide (Salicide) process. Materials for forming a self-aligned silicide layer include titanium silicide ($TiSi_x$) and cobalt silicide ($CoSi_x$). Because titanium silicide has the advantage of easy control during fabrication, it is one of the most frequently employed silicide materials.

Titanium silicide layer can be further classified structurally as being in a C49 high-resistance metastable phase (C49-$TiSi_2$) or in a C54 low-resistance thermodynamically stable phase (C54-$TiSi_2$). To form a titanium silicide layer, a first stage rapid thermal heating process is carried out so that titanium in a titanium layer reacts with silicon in a silicon layer. After the first stage thermal process, C49 phase titanium silicide and a small amount of C54 phase titanium silicide are formed. The unreacted titanium layer is removed, and then a second stage rapid thermal heating operation is carried out at an elevated temperature. In the second stage thermal operation, the high-resistance C49 phase titanium silicide within the titanium silicide layer is gradually transformed into a low-resistance C54 phase titanium silicide.

C49 phase titanium silicide has a low formation temperature but its electrical resistance is high. In contrast, C54 phase titanium silicide has a low electrical resistance but its formation temperature is high. In general, a rapid thermal process for transforming the high-resistance C49 phase titanium silicide in a titanium silicide layer into low-resistance C54 phase titanium silicide must be employed. Furthermore, in order to form a thick and uniform silicide layer, processing temperature must be raised or the period of heating must be extended.

As dimensions of the polysilicon gate are gradually reduced due to miniaturization, the formation temperature of the C54 phase titanium silicide is increased because of the narrow line effect. The narrow line effect refers to the increase in phase transformation temperature resulting from a decrease in line width.

In other words, as line width becomes smaller, temperature required to transform high-resistance C49 phase titanium silicide into low-resistance C54 phase titanium silicide is increased. However, raising the rapid thermal processing temperature to obtain C54 phase titanium silicide may result in some instability in the resulting silicide layer. Hence, too high a processing temperature is unsuitable for forming small dimensional devices. Moreover, reaction temperature is difficult to control and may result in lateral growth of the silicide layer. In addition, as the level of integration continues to increase and separation between neighboring devices continues to decrease, lateral growth can easily lead to bridging between a gate terminal and a source/drain terminal. To prevent such bridging, an upper limit to the temperature for forming a metal silicide layer must be set. However, this will result in an intensification of the narrow line effect. Hence, a higher resistance will be formed at the polysilicon gates.

SUMMARY OF THE INVENTION

The invention provides a method for increasing gate surface area for depositing silicide material. A silicon substrate having device isolation structures therein is provided. A stack of sacrificial layers comprising a first sacrificial layer at the bottom, a second sacrificial layer in the middle and a third sacrificial layer at the top is formed over the silicon substrate. A gate opening is formed in the stack of sacrificial layers to expose a portion of the substrate. A portion of the second sacrificial layer exposed by the gate opening is next removed to form a horizontal side opening on each side of the gate opening. The gate opening together with the horizontal side opening form cross-shaped hollow space. A gate oxide layer is formed at the bottom of the gate opening. Polysilicon material is deposited to fill the gate opening and the side openings, thereby forming a cross-shaped gate polysilicon layer. The third, the second and the first sacrificial layers are removed. A metal silicide layer is formed over the gate polysilicon layer.

This invention also provides a method of manufacturing a semiconductor device on a silicon substrate having device isolation structures therein. The method includes forming a stack of sacrificial layers over the silicon substrate. The stack comprises of a first sacrificial layer at the bottom, a second sacrificial layer in the middle and a third sacrificial layer on top. A gate opening is formed in the stack of sacrificial layer to expose a portion of the substrate. A portion of the second sacrificial layer exposed by the gate opening is removed, thereby forming a horizontal side opening on each side of the gate opening. These horizontal side openings together with the gate opening form a cross-shaped hollow space. A gate oxide layer is next formed at the bottom of the gate opening. Polysilicon material is deposited to fill the cross-shaped hollow space, thereby forming a gate polysilicon layer having a cross-shaped profile. The gate polysilicon layer includes a vertical main body together with a pair of horizontal arms, one on each side of the main body. The third sacrificial layer, the second sacrificial layer and a portion of the first sacrificial layer are removed so that a portion of the first sacrificial layer remains under the arms of the gate polysilicon layer. A heavy implantation is carried out to form a heavily doped source/drain region in the silicon substrate on each side of the gate polysilicon layer. The residual first sacrificial layer under the arms is removed. A light implantation is next carried out to form a lightly doped source/drain region in the silicon substrate under each arm. A silicide process is conducted to form a silicide layer over the gate polysilicon layer and the heavily doped source/drain regions. Insulating material is deposited over the silicon substrate to form an insulation layer so that spacers filled with air are also formed under the arms. The air spacers serve to reduce parasitic capacitance between the gate terminal and neighboring source/drain regions.

Aside from increasing the area coverage of silicide layer over the gate terminal, the formation of an air spacer underneath each arm is capable of lowering the dielectric constant. Hence, parasitic capacitance between the gate terminal and the source/drain region is reduced and operating speed of the device is increased. Furthermore, by forming the heavily doped source/drain regions before forming the lightly doped source/drain regions, a lower annealing temperature can be used. Consequently, shallow junctions are formed in the lightly doped source/drain regions and the short-channel effect is minimized.

In the invention, the gate structure with a cross-shaped sectional profile is formed, thereby increasing effective surface area for depositing silicide. With more silicide material on the gate, narrow line effect is prevented and contact resistance at the gate terminal is reduced. Furthermore, the air space under each arm of the cross forms a spacer that can reduce parasitic capacitance between the gate terminal and neighboring source/drain terminal.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
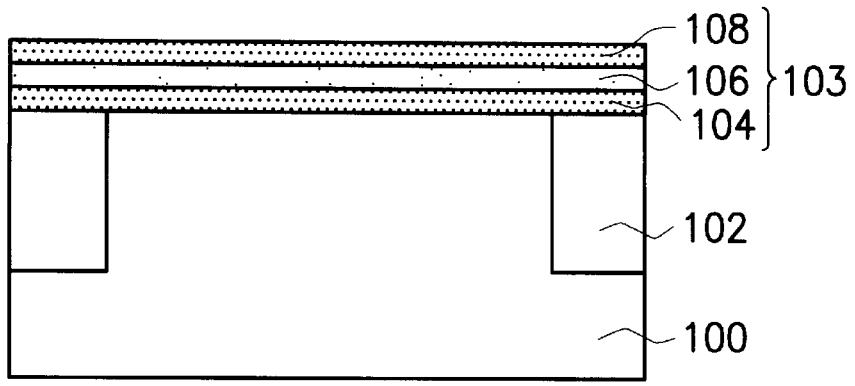
FIGS. 1A through 1H are schematic cross-sectional views showing the progression of steps for producing a MOS transistor with a cross-shaped gate polysilicon layer according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1H are schematic cross-sectional views showing the progression of steps for producing a MOS transistor with a cross-shaped gate polysilicon layer according to one preferred embodiment of this invention.

As shown in FIG. 1A, a silicon substrate 100 having device isolation structures 102 such as shallow trench isolation (STI) therein is provided. A stack of sacrificial layers 103 is formed over the silicon substrate 100. The stack includes a first sacrificial layer 104 at the bottom, a second sacrificial layer 106 in the middle and a third sacrificial layer 108 at the top. The first sacrificial layer 104 preferably has a thickness of about 800 angstroms to 1000 angstroms, the second sacrificial layer 106 preferably has a thickness of about 500 angstroms to 800 angstroms and the third sacrificial layer 108 preferably has a thickness of about 800 angstroms to 1000 anstroms. The stack of sacrificial layers 103 can be formed by, for example, depositing silicon nitride, silicon oxide and silicon nitride in sequence by chemical vapor deposition. However, the second sacrificial layer 106 must be formed using a material having an etching rate that differs from the first sacrificial layer 104 and the third sacrificial layer 108.

Figure 1B:
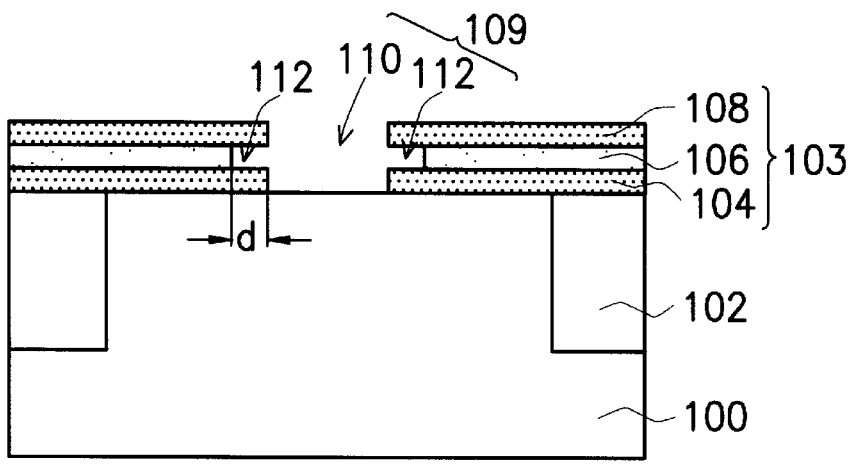

As shown in FIG. 1B, a cross-shaped opening 109 is formed in the stack of sacrificial layers 103. The cross-shaped opening 109 includes a central gate opening 110 and a horizontal side opening 112 on each side of the gate opening 110. The opening 109 can be formed by patterning the stack layers 103 to form a gate opening 110 that exposes a portion of the substrate 100 using conventional photolithographic and etching techniques. A selective wet etching operation of the exposed second sacrificial layer 106 inside the gate opening 110 is next carried out to form side openings 112 using a buffered oxide etchant (BOE). The gate opening 110 and the side openings 112 constitute the cross-shaped opening 109. Width d of the side openings 112 can be controlled by adjusting the etching rate of the BOE in the wet etching step. Preferably, the width d of each side openings 112 is about 500 angstroms.

Figure 1C:
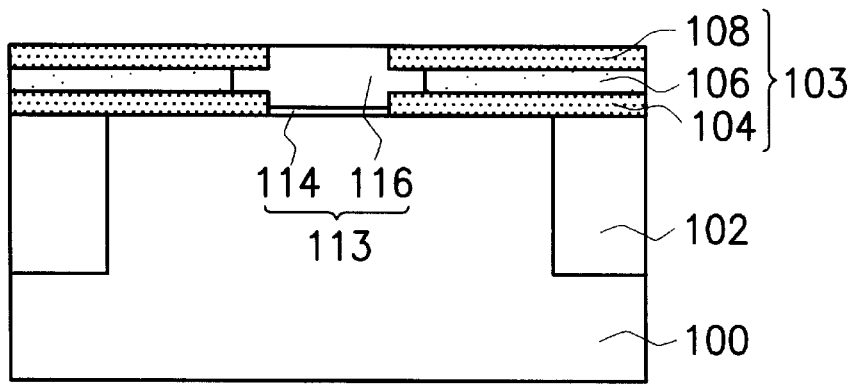

As shown in FIG. 1C, a thin gate oxide layer 114 is formed at the bottom of the gate opening 110. The gate oxide layer 114 can be formed by, for example, thermally oxidizing the silicon on the exposed substrate surface. Polysilicon is deposited to fill the gate opening 110 and the side openings 112, thereby forming a gate polysilicon layer 116. The gate polysilicon layer 116 can be formed by, for example, depositing polysilicon over the silicon substrate 100 to fill the gate opening 110 and the side openings 112 in chemical vapor deposition. Excess polysilicon above the stack of sacrificial layers 103 is next removed by chemical-mechanical polishing or by etching. The gate oxide layer 114 and the gate polysilicon layer 116 together form a gate electrode 113.

Figure 1D:
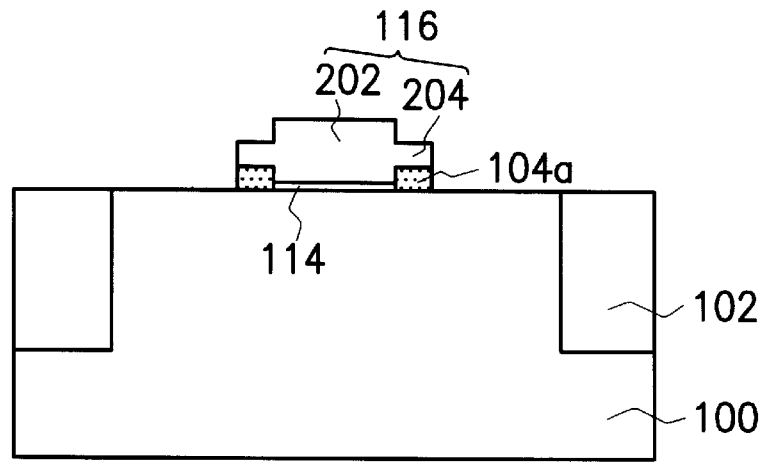

As shown in FIG. 1D, the cross-shaped gate polysilicon structure 116 is exposed by removing the third sacrificial layer 108, the second sacrificial layer 106 and a portion of the first sacrificial layer 104 in sequence. The cross-shaped gate polysilicon layer 116 actually includes a central main body 202 and an arm 204 on each side of the main body 202. The remaining first sacrificial layer 104a is formed under the arms 204. The cross-shaped structure 116 of this invention is capable of increasing the coverage of silicide layer on the gate without increasing the gate line width.

The first sacrificial layer 104 and the third sacrificial layer 108 can be a silicon nitride layer while the second sacrificial layer 106 can be a silicon oxide layer, for example. If the third sacrificial layer 108 is a silicon nitride layer, the third sacrificial layer 108 can be removed using phosphoric acid ($H_3PO_4$) in a wet etching operation. If the second sacrificial layer 106 is a silicon oxide layer, the second sacrificial layer 106 can be removed using a buffered oxide etchant (BOE). A thin oxide layer that serves as a protective layer (not shown) is formed over the gate polysilicon layer 116 and the silicon substrate 100 by thermal oxidation. Finally, am anisotropic etching operation is carried out to remove the exposed first sacrificial layer 104 using the gate polysilicon layer 116 as a mask. Consequently, a first sacrificial layer 104a remains underneath the arms 204.

Figure 1E:
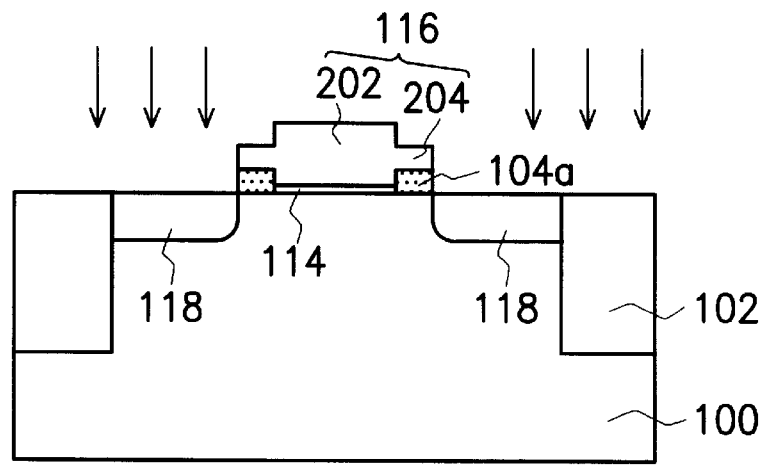

As shown in FIG. 1E, a heavy implantation is carried out to form a heavily doped source/drain region 118 in the substrate 100 on each side of the gate polysilicon layer 116. The gate polysilicon layer 116 is used as a mask in the heavy implantation. For an N-type transistor, N-type ions such as arsenic ions can be used as the dopants in the ion implantation. The heavy implantation is carried out at an energy level of about 50 KeV and at a dosage level of about 3E15 atoms/cm$^2$. For a P-type transistor, P-type ions such as boron ions can be used as the dopants in the ion implantation. The heavy implantation is carried out at an energy level of about 8 KeV and at a dosage level of about 4E15 atoms/cm$^2$. After the implantation, an annealing operation such as a rapid thermal annealing (RTA) can be conducted at a temperature of about 1000° C. for 10 seconds.

Figure 1F:
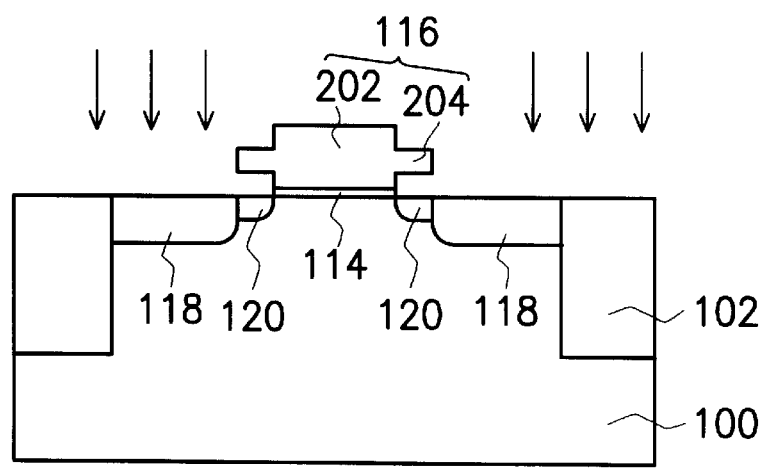

As shown in FIG. 1F, the residual first sacrificial layers 104a under the arms 204 are removed. If the first sacrificial layers 104a are silicon nitride layers, the first sacrificial layers 104a can be removed using phosphoric acid ($H_3PO_4$) in an isotropic wet etching operation. A light implantation is carried out so that some of the dopants can penetrate into the substrate 100 underneath the arms 204. In other words, the regions in the substrate 100 next to the heavily doped source/drain regions 118 but closer to the gate polysilicon structure 116 are doped to form lightly doped source/drain regions 120. For an N-type transistor, N-type dopants such as phosphorus can be used as the dopants in the ion implantation. Preferably, the light implantation is carried out at an energy level of about 30 to 50 KeV and at a dosage level of about 5E14 atoms/$cm^2$. For a P-type transistor, P-type dopants such as boron difluoride ($BF_2$) can be used as the dopants in the ion implantation. Preferably, the light implantation is carried out at an energy level of about 20 to 30 KeV and at a dosage level of about 5E15 atoms/$cm^2$. After the light implantation, an annealing operation such as a rapid thermal annealing (RTA) can be conducted at a temperature of about 850° C. to 900° C. for 10 seconds.

By monitoring the parameters in the light implantation and the annealing operation, junction depth of the lightly doped source/drain regions 120 can be carefully controlled. Because the heavily doped source/drain regions 118 is formed before the lightly doped source/drain regions 120, the second annealing process can be conducted at a temperature below 1000° C. Hence, a shallower junction depth and a better junction profile than a conventional lightly doped source/drain region can be obtained, and the transistor is less affected by short-channel effect.

Figure 1G:
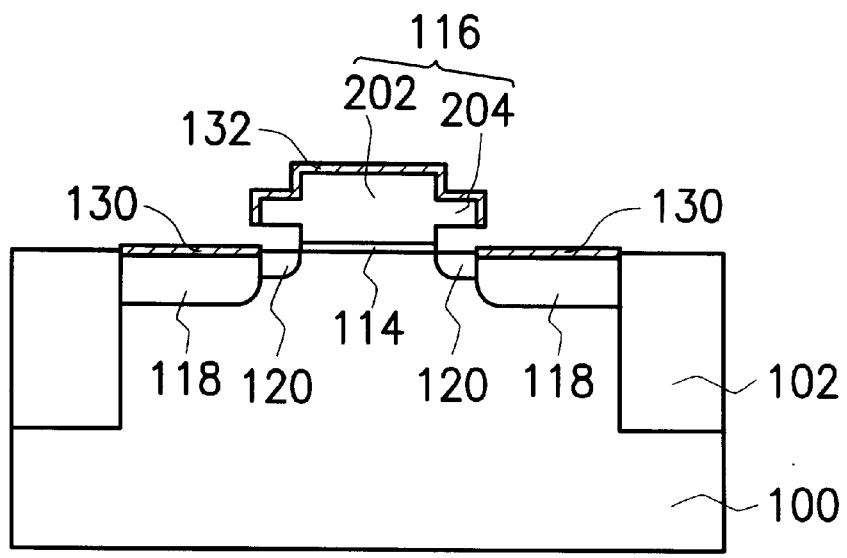

As shown in FIG. 1G, a silicide process is carried out to form a silicide layer 130 on the heavily doped source/drain regions 118 and another silicide layer 132 on the gate polysilicon layer 116. The silicide layers 130 and 132 can be formed, for example, using a material such as titanium silicide ($TiSi_2$) or cobalt silicide ($CoSi_2$). If the silicide layers 130 and 132 are titanium silicide layers, the silicide layers 130 and 132 are formed by sputtering titanium over the substrate 100 to form a titanium layer. A first annealing operation is then performed so that titanium and silicon at their junction interface react to form a titanium silicide layer. The unreacted titanium layer is removed, and then a second annealing operation is performed so that the original high-resistance C49 phase titanium silicide is transformed into a low-resistance C54 phase titanium silicide.

Due to the presence of a horizontal arm 204 on each side of the main body 202, area coverage of silicide over the gate electrode is increased without any increase in the gate line width. Consequently, narrow line effect can be minimized and contact resistance of the gate electrode can be reduced. Therefore, the self-aligned silicide process can be applied to the production of sub-0.18 μm devices.

Figure 1H:
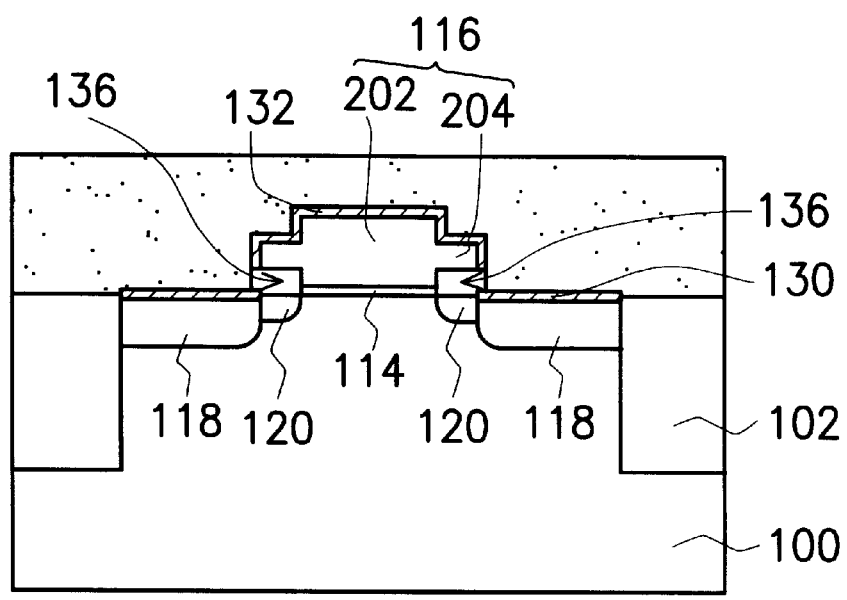

As shown in FIG. 1H, insulating material is deposited over the silicon substrate 100 to form an insulation layer 134. The insulation layer 134 can be a silicon oxide layer formed by, for example, reactive sputtering deposition. Utilizing the anisotropic depositing properties, spacers 136 containing just air are formed under the arms 204. Since air has a dielectric constant lower than most other dielectric materials (a dielectric constant of about one), parasitic capacitance between the gate electrode and its neighboring source/drain regions is greatly reduced. Hence, signal transmission delay (RC-delay) can be reduced and operating speed of the device can be increased.

In summary, the advantages of this invention includes:

1. A cross-shaped gate electrode is formed, and so subsequently formed silicide layer can cover more area. Hence, contact resistance of the gate electrode is lowered and narrow line effect is minimized.

2. A shallow junction is formed in the lightly doped source/drain region. Hence, the short-channel effect can be reduced.

3. Air spacers are formed under the arms of the gate electrode. Therefore, parasitic capacitance between the gate electrode and the source/drain regions nearby is greatly reduced, and thus operating speed of the device is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a gate structure having an increased surface area for depositing silicide material, comprising the steps of:
   providing a silicon substrate having device isolation structures therein;
   forming a stack of sacrificial layers on the substrate, wherein the stack of sacrificial layers includes a first sacrificial layer, a second sacrificial layer and a third sacrificial layer formed in sequence over the substrate;
   forming a gate opening in the stack of sacrificial layers by removing a portion of the stack of sacrificial layers, wherein the removal of the portion of the stack of sacrificial layers exposes a portion of the substrate;
   removing a portion of the exposed second sacrificial layer on each side of the gate opening so that horizontal side openings are formed;
   forming a gate oxide layer at a bottom of the gate opening;
   depositing polysilicon material to fill the gate opening and the horizontal side openings to form a cross-shaped gate polysilicon layer comprising a vertical main body and two arms;
   removing the third sacrificial layer, the second sacrificial layer and the first sacrificial layer;
   forming a metal silicide layer on the gate polysilicon layer; and
   forming an insulation layer over the silicon substrate so that an air spacer is formed under each arm of the cross-shaped gate polysilicon layer.

2. The method of claim 1, wherein the first sacrificial layer includes a silicon nitride layer.

3. The method of claim 1, wherein the first sacrificial layer has a thickness of about 800 angstroms to 1000 angstroms.

4. The method of claim 1, wherein the second sacrificial layer includes a silicon oxide layer.

5. The method of claim 1, wherein the second sacrificial layer has a thickness of about 500 angstroms to 800 angstroms.

6. The method of claim 1, wherein the third sacrificial layer includes a silicon nitride layer.

7. The method of claim 1, wherein the third sacrificial layer has a thickness of about 800 angstroms to 1000 angstroms.

8. The method of claim 1, wherein the step of removing the second sacrificial layer includes isotropic wet etching.

9. The method of claim 1, wherein the step of removing the second sacrificial layer includes using a buffered oxide etchant.

10. The method of claim 1, wherein the horizontal side opening has a width of about 500 angstroms.

11. The method of claim 1, wherein the metal silicide layer includes a titanium silicide layer.

12. The method of claim 1, wherein after removing the third sacrificial layer, the second sacrificial layer and the first sacrificial layer, further comprising:

performing a heavy implantation in the substrate on each side of the cross-shaped gate polysilicon layer using the cross-shaped gate polysilicon layer as a mask; and performing a light implantation in the substrate underneath the arms subsequent to the heavy implantation.

13. A method of manufacturing a semiconductor device, comprising the steps of:

providing a silicon substrate having a plurality of device isolation structures therein;

forming a stack of sacrificial layers over the substrate, wherein the stack of sacrificial layers includes, from bottom to top, a first silicon nitride layer, a first silicon oxide layer and a second silicon nitride layer;

forming a gate opening in the stack of sacrificial layers to expose a portion of the substrate;

removing a portion of the exposed first silicon oxide layer on each side of the gate opening so that horizontal side openings are formed;

forming a gate oxide layer at a bottom of the gate opening;

depositing polysilicon material to fill the gate opening and the horizontal side openings to form a cross-shaped gate polysilicon layer that includes a vertical main body and two arms;

removing the second silicon nitride layer, the first silicon oxide layer and a portion of the first silicon nitride layer such that a portion of the silicon nitride layer remains under the arms;

performing a heavy implantation to implant dopants into the substrate on each side of the gate polysilicon layer to form heavily doped source/drain regions;

removing the residual first silicon nitride layer;

performing a light implantation to implant dopants into the substrate under the arms to form lightly doped source/drain regions;

forming a metal silicide layer over the gate polysilicon layer and the heavily doped source/drain regions; and forming an insulation layer over the silicon substrate so that an air spacer is formed under each arm.

14. The method of claim 13, wherein the first silicon nitride layer has a thickness of about 800 angstroms to 1000 angstroms.

15. The method of claim 13, wherein the first silicon oxide layer has a thickness of about 500 angstroms to 800 angstroms.

16. The method of claim 13, wherein the second silicon nitride layer has a thickness of about 800 angstroms to 1000 angstroms.

17. The method of claim 13, wherein the step of removing the first silicon oxide layer includes isotropic wet etching.

18. The method of claim 13, wherein the horizontal side opening has a width of about 500 angstroms.

19. The method of claim 13, wherein after the step of performing the light implantation, further includes an annealing operation.

20. The method of claim 19, wherein the annealing operation is conducted at a temperature of about 850° C. to 900° C.

21. The method of claim 13, wherein the metal silicide layer includes a titanium silicide layer.

22. The method of claim 13, wherein the step of forming the insulation layer includes sputtering silicon oxide.

23. The method of claim 22, wherein the step of sputtering silicon oxide includes performing a reactive sputtering deposition.

24. A method of forming a cross-shaped gate structure, comprising the steps of:

providing a silicon substrate having a plurality of device isolation structures therein;

forming a stack of sacrificial layers over the substrate, wherein the stack of sacrificial layers includes, from bottom to top, a first sacrificial layer, a second sacrificial layer and a third sacrificial layer;

forming a gate opening in the stack of sacrificial layers by removing a portion of the stack of sacrificial layers, wherein the removal of the portion of the stack of sacrificial layers exposes a portion of the substrate;

removing a portion of the exposed second sacrificial layer on each side of the gate opening so that horizontal side openings are formed;

forming a gate oxide layer at a bottom of the gate opening;

depositing polysilicon material to fill the gate opening and the horizontal side openings to form the cross-shaped gate polysilicon structure that comprises a vertical main body and two arms;

removing the third sacrificial layer, the second sacrificial layer and the first sacrificial layer; and forming an insulation layer over the silicon substrate so that an air spacer is formed under each arm of the cross-shaped gate polysilicon structure.

25. The method of claim 24, wherein the first sacrificial layer includes a silicon nitride layer.

26. The method of claim 24, wherein the second sacrificial layer includes a silicon oxide layer.

27. The method of claim 24, wherein the third sacrificial layer includes a silicon nitride layer.

28. The method of claim 24, wherein the step of forming the side openings includes isotropic wet etching.

29. The method of claim 24, wherein the horizontal side opening has a width of about 500 angstroms.

30. The method of claim 24, wherein after removing the third sacrificial layer, the second sacrificial layer and the first sacrificial layer, further comprising:

performing a heavy implantation in the substrate on each side of the cross-shaped gate polysilicon structure using the cross-shaped gate polysilicon structure as a mask; and performing a light implantation in the substrate underneath the arms subsequent to the heavy implantation.

* * * * *